United States Patent
Choi et al.

(10) Patent No.: US 7,219,825 B2
(45) Date of Patent: May 22, 2007

(54) SNAGAU SOLDER BUMPS, METHOD OF MANUFACTURING THE SAME, AND METHOD OF BONDING LIGHT EMITTING DEVICE USING THE SAME

(75) Inventors: Won-kyoung Choi, Gyeonggi-do (KR); Su-hee Chae, Gyeonggi-do (KR); Joon-seop Kwak, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/949,522

(22) Filed: Sep. 27, 2004

(65) Prior Publication Data
US 2005/0072835 A1 Apr. 7, 2005

(30) Foreign Application Priority Data
Oct. 1, 2003 (KR) .................. 10-2003-0068321

(51) Int. Cl.
*B23K 35/14* (2006.01)
*B23K 31/02* (2006.01)
(52) U.S. Cl. .................. 228/56.3; 228/180.22; 438/612; 257/778

(58) Field of Classification Search ........... 228/180.21, 228/180.22, 248.1; 438/612; 257/778
See application file for complete search history.

(56) References Cited

U.S. PATENT DOCUMENTS

| | | | |
|---|---|---|---|
| 5,234,153 A * | 8/1993 | Bacon et al. ............ 228/122.1 |
| 6,130,476 A * | 10/2000 | LaFontaine et al. ........ 257/678 |
| 6,165,885 A * | 12/2000 | Gaynes et al. ............. 438/612 |
| 6,573,537 B1 * | 6/2003 | Steigerwald et al. ........ 257/103 |
| 6,762,506 B2 * | 7/2004 | Amagai et al. ............. 257/786 |
| 2001/0010449 A1 * | 8/2001 | Chiu et al. .................. 313/501 |
| 2001/0013423 A1 * | 8/2001 | Dalal et al. ................. 174/260 |
| 2003/0222270 A1 * | 12/2003 | Uemura ........................ 257/99 |
| 2003/0222352 A1 * | 12/2003 | Kung et al. ................. 257/772 |
| 2004/0201110 A1 * | 10/2004 | Venugopalan et al. ...... 257/778 |
| 2004/0258556 A1 * | 12/2004 | Kim et al. ................... 420/560 |
| 2005/0041934 A1 * | 2/2005 | Zama et al. .................. 385/92 |
| 2005/0110161 A1 * | 5/2005 | Naito et al. ................. 257/778 |

\* cited by examiner

*Primary Examiner*—Lynne R. Edmondson
(74) *Attorney, Agent, or Firm*—Buchanan Ingersoll & Rooney PC

(57) ABSTRACT

Provided are a solder bump, a method of manufacturing the same, and a method of bonding a light emitting device using the method of manufacturing the solder bump. In particular, the solder bump is formed of a compound including a first element through a third element, in which the first and third elements together form a compound having a plurality of intermediate phases and solidus lines.

19 Claims, 5 Drawing Sheets

SNAGAU SOLDER BUMPS, METHOD OF MANUFACTURING THE SAME, AND METHOD OF BONDING LIGHT EMITTING DEVICE USING THE SAME

BACKGROUND OF THE INVENTION

This application claims the priority of Korean Patent Application No. 2003-68321, filed on Oct. 1, 2003, in the Korean Intellectual Property Office, the disclosure of which is incorporated herein in its entirety by reference.

1. Field of the Invention

The present invention relates to a bonding medium, a method of manufacturing the same, and a method of bonding two parts using the method of manufacturing the bonding medium, and more particularly, to a SnAgAu solder bump and a method of manufacturing the same, and a method of bonding a light emitting device using the solder bump.

2. Description of the Related Art

Wire bonding has been widely used for bonding a light emitting device and a submount. The wire bonding between a light emitting device and a submount is performed not only to apply a driving voltage to the light emitting device, but also to remove heat generated by the light emitting device during its operation.

In light emitting devices such as LDs or LEDs, it is preferable for a channel through which current is supplied to have a low resistance, in order to keep the driving voltage at a low level. In addition, it is preferable for heat generated by the light emitting devices to be removed rapidly.

Meanwhile, as the integration density of chips including light emitting devices increases, the length of wires connecting the light emitting devices to submounts seems to be increased.

Because a line resistance of the wires connecting the light emitting devices to the submounts is proportional to the wire's length, the increased length of the wires is accompanied by increased resistance.

Therefore, when current is provided to the light emitting devices via the wires, the driving voltage is increased. Additionally, when heat from the light emitting devices is removed via the wires, heat removal efficiency is decreased, ultimately leading to further increase in the driving voltage of the light emitting devices.

Accordingly, flip-chip bonding has been recently used instead of wire bonding between a light emitting device and a submount.

When a light emitting device is connected to a submount using the flip-chip bonding, heat resistance and line resistance are lower than in the case of wire boning, because they are directly connected via solder bumps.

FIG. 1 illustrates conventional technology in which a light emitting device is bonded to a submount using the flip-chip bonding.

Referring to FIG. 1, reference numerals 14 and 16 denote a light emitting device and a submount, respectively. The light emitting device 14 is flipped to be bonded to the submount 16. The light emitting device 14 includes a compound semiconductor layer 12 and a substrate on which the semiconductor layer 12 is formed. The compound semiconductor layer 12 includes, for example, an n-type compound semiconductor layer (not shown), a p-type compound semiconductor layer (not shown) and an active layer interposed therebetween. First and second pad layers 22a and 22b are formed on the submount 16 and separated from one another. The first and second pad layers 22a and 22b faces two regions of the compound semiconductor layer 12, respectively: one region where an n-type electrode (not shown) is formed, and the other region (protruding toward the submount 16) where a p-type electrode (not shown) is formed. A step S is formed between the two regions. A pad layer 18a, which contacts the n-type electrode, is formed in the region of the compound semiconductor layer 12 where the n-type electrode is formed, and a pad layer 18b, which contacts the p-type electrode, is formed in the region of the compound semiconductor layer 12 where the p-type electrode is formed. In addition, a portion of a surface of the pad layer 18a facing the submount 16 that contacts n-type electrode is covered with a first Au film 20a, and a portion of a surface of the pad layer 18b facing the submount 16 that contacts the p-type electrode is covered with a second Au film 20b.

A first Pt film 24a is formed on an upper surface of the first pad layer 22a deposited on the submount 16, and a second Pt film 24b is formed on an upper surface of the second pad layer 22b. The first Pt film 24a faces the first Au film 20a, and the second Pt film 24b faces the second Au film 20b. The first Pt film 24a is connected to the first Au film 20a by a first AuSn solder bump 26a, and the second Pt film 24b is connected to the second Au film 20b by a second AnSn solder bump 26b. The first and second Pt films 24a and 24b prevent diffusion of Sn from the first and second AnSn solder bumps 26a and 26b into the first and second pad layers 22a and 22b.

In the conventional technology described above, the first and second AuSn solder bumps 26a and 26b are formed by heating AuSn solder at a temperature of 280° C. or more for a few seconds. When the AuSn solder is heated at a temperature of 280° C. or more, characteristics of a metal layer for the p-type electrode change. As a result, the contact resistance of the p-type electrode increases, leading to an increase in the driving voltage of the light emitting device.

SUMMARY OF THE INVENTION

The present invention provides a solder bump which is formed at a lower temperature than a temperature at which the resistance of an electrode of a light emitting device changes, and increases thermal stability in a process following bonding of the light emitting device with a submount.

The present invention also provides a method of manufacturing the solder bump.

The present invention further provides a method of bonding a light emitting device using the solder bump.

According to an aspect of the present invention, there is provided a solder bump formed of a compound comprising a first element through a third element,
  wherein the first element and the third element form a compound having a plurality of intermediate phases and solidus lines. The first element may be Sn. The second element may be Ag. The third element may be one of Au, Pd, Ni, Cu, and Na. The amount of Ag is in the range of 3.3%–8% or 3%–7.32% by weight. The amount of Au is in the range of 20%–36.63% or 29.32%–48.96% by weight.

According to an aspect of the present invention, there is provided a method of forming a solder bump comprising: (a) forming a first material supplying film on a base substrate; (b) forming a solder bump of a binary compound on the first material supplying film; and (c) heating the resultant structure on which the solder bump is formed. The first material supplying film may be one of an Au film, a Pd film, an Ni film, a Cu film, and an Na film. Also, the solder bump may be formed of a compound comprising SnAg.

The amount of Ag may be in the range of 3.3%–8%.

The resultant structure may be heated at a temperature in the range of 205° C.–235° C.

The step (c) may be performed after an upper film is attached to an upper portion of the solder bump. The second material supplying film may be further formed between the upper portion of the solder bump and the upper film. The second material supplying film may be formed of one of an Au film, a Pd film, an Ni film, a Cu film and an Na film.

According to an aspect of the present invention, there is provided a method of bonding a light emitting device using the solder bump, comprising: (a) forming a light emitting device comprising a p-type electrode, an n-type electrode, and a compound semiconductor layer formed between the p-type electrode and the n-type electrode; (b) forming a first pad layer and a second pad layer on a submount such that the first and second pad layers are separated from one another; (c) forming, on the light emitting device, a pad layer contacting the p-type electrode and another pad layer contacting the n-type electrode; (d) forming a first solder bump on the first pad layer and a second solder bump on the second pad layer; (e) bonding the light emitting device to the submount by bonding the pad layer contacting the n-type electrode and the pad layer contacting the p-type electrode with the first and second solder bumps, respectively, wherein the first and second pad layers include a first predetermined material film that supplies the first and second solder bumps with a predetermined substance during the bonding, to increase the melting point of the first and second solder bumps.

A Ti film, a Pt film, and the first predetermined material film may be sequentially deposited to form the first and second pad layers.

An Au film, a Pt film, and a Ti film may be sequentially deposited to form the pad layer contacting the n-type electrode and the pad layer contacting the p-type electrode.

The first and second solder bumps may be formed of SnAg and the amount of Ag is in the range of 3.3%–8%.

The first predetermined material film may comprise a first element which forms a compound having a plurality of intermediate phases and solidus lines together with an element included in the first and second solder bumps.

The first element is one of Au, Pd, Ni, Cu, and Na.

The step (e) may comprise sub-steps of: arranging the light emitting device and the submount so that the pad layer contacting the n-type electrode and the pad layer contacting the p-type electrode face the first and second solder bumps, respectively; bringing the pad layer contacting the n-type electrode and the pad layer contacting the p-type electrode into contact with the first and second solder bumps, respectively; and heating the resultant structure at a temperature of 205–235° C.

The solder bump whose the melting point is increased may be formed of SnAgAu in which the amount of Ag is in the range of 3.3%–8% and the amount of Au is in the range of 20%–36.63%.

During the heating process, a force applied to the resultant structure is in the range of 10 g–100 g.

a second predetermined material film may be further formed on the pad layer contacting the n-type electrode and the pad layer contacting the p-type electrode, and the second predetermined material film has the same function as the first predetermined material film.

The second predetermined material film may comprises a second element which forms a compound having a plurality of intermediate phases and solidus lines together with an element included in the first and second solder bumps.

The second element may be one of Au, Pd, Ni, Cu, and Na.

According to the present invention, a flip-chip bonding of a light emitting device with a submount is performed at a much lower than conventional temperature. As a result, the present invention solves the problem of increased electrode resistance in a light emitting device, which results in an increased driving voltage, arising during the conventional flip-chip bonding process. In addition, according to the present invention, the melting point of a solder bump formed during the flip-chip bonding process is 255° C. or more. Thus, in a subsequent process that is performed at a temperature of less than 200° C., the solder bump maintains its first state. In other words, the solder bump can be maintained in a thermally stable condition. Therefore, according to the present invention, uniform laser beams can be emitted from a light emitting device, in particular, from an LD, and emission characteristics and reliability of the LD can be improved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
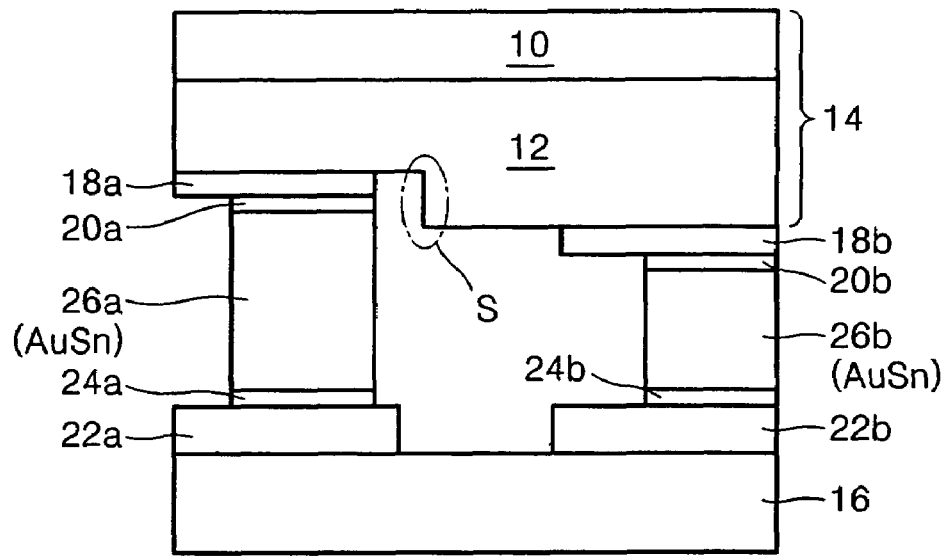
FIG. 1 is a cross-sectional view illustrating a conventional bonding method in which a light emitting device is bonded to a submount.

Hereinafter, a solder bump for bonding, a method of manufacturing the same, and a method of bonding a light emitting device using the solder bump, according to the present invention, will be described in detail by explaining embodiments of the invention with reference to the attached drawings. In the drawings, the thickness of layers and regions may be exaggerated for clarity.

Embodiments of the solder bump and the method of manufacturing the same will be described in the course of describing an embodiment of a method of bonding a light emitting device to a submount.

Figure 2:
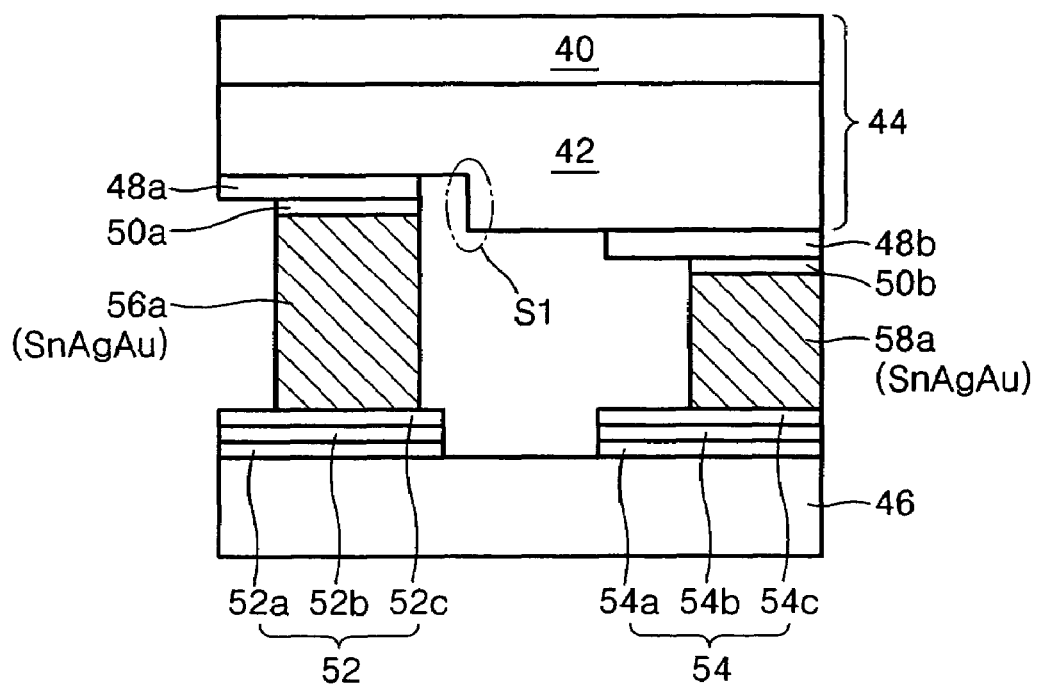
FIG. 2 is a cross-sectional view illustrating a solder bump manufactured according to an embodiment of the present invention and a light emitting device bonded to a submount by the solder bump.

Referring to FIG. 2, reference numeral 44 denotes a light emitting device, such as a GaN compound semiconductor laser diode (LD) or a light emitting diode (LED). The light emitting device 44 includes a substrate 40 and a compound semiconductor layer 42 deposited on a lower surface of the substrate 40. The substrate 40 may be a high-resistance substrate such as a sapphire substrate or a transparent substrate through which light generated from the compound semiconductor layer 42 passes. The compound semiconductor layer 42 comprising an n-type compound semiconductor layer (not shown) and a p-type compound semiconductor layer (not shown). The n-type compound semiconductor layer contacts the substrate 40. The p-type compound semiconductor layer faces the n-type compound semiconductor. An active layer (not shown), in which light is generated, is formed between the n-type and p-type compound semiconductor layers. When the light emitting device 44 is an LD, an n-type clad layer can be further formed between the active layer and the n-type compound semiconductor layer, and a p-type clad layer can be further formed between the active layer and the n-type compound semiconductor layer. A p-type electrode (not shown) connected to the p-type compound semiconductor layer is formed in a portion protruding downward from the compound semiconductor layer 42. The compound semiconductor layer 42 has an n-type electrode (not shown) in the left region of a step (S1). The p-type electrode may be flat or ridge-like in form. A pad layer, for example an n-type electrode pad layer 48a, which is electrically connected to the n-type electrode, is formed in a region of the compound semiconductor layer 42 in which the n-type electrode is formed. Another pad layer, for example a p-type electrode pad layer 48b, which is electrically connected to the p-type electrode, is formed in a region of the compound semiconductor layer 42 in which the p-type electrode is formed. A first conductive film 50a is attached to a lower surface of the n-type electrode pad layer 48a, and a second conductive film 50b is attached to a lower surface of the p-type electrode pad layer 48b. The n-type and p-type electrode pad layers 48a and 48b may be multi-layers or single layers. When the n-type and p-type electrode pad layers 48a and 48b are respectively multi-layers, the n-type electrode pad layer 48a may be composed of an Au film, which covers all or a portion of the n-type electrode, a Pt film, and a Ti film. Here, the Au film, the Pt film, and the Ti film are sequentially deposited. The p-type electrode pad layer 48b may be composed of an Au film, which covers all or a portion of the p-type electrode, and a Pt film, and a Ti film. Here, the Au film, the Pt film, and the Ti film are sequentially deposited. The first conductive film 50a is formed on a lower surface of the n-type electrode pad layer 48a, and the second conductive film 50b is formed on a lower surface of the p-type electrode pad layer 48b. The first and second conductive films 50a and 50b may be identical conductive films or may be different from one another. If the first and second conductive films 50a and 50b are identical conductive films, they may be a conductive film comprising an element included in a solder bump described below, for example one film of an Au film, a Pd film, a Ni film, a Cu film, and a Na film. The element included in the solder bump may be an element which has a plurality of solidi because at least two intermediate phases exist in a phase diagram with Sn.

Referring to FIG. 2, reference numeral 46 denotes a submount facing the light emitting device 44. First and second pad layers 52 and 54 are formed on the submount 46 and separated from one another. The first pad layer 52 faces the n-type electrode pad layer 48a and the second pad layer 54 faces the p-type electrode pad layer 48b. The first pad layer 52 includes first through third metal layers 52a, 52b and 52c which are sequentially deposited, and the second pad layer 54 includes fourth through sixth metal layers 54a, 54b and 54c which are sequentially deposited. The first through third metal layers 52a, 52b and 52c may be the same as or different from the fourth through sixth metal layers 54a, 54b and 54c, respectively. For example, when the first through third metal layers 52a, 52b and 52c are the same as the fourth through sixth metal layers 54a, 54b and 54c, the first and fourth metal layers 52a and 54a may be Ti films, the second and fifth metal layers 52b and 54b may be Pt films, and the third and sixth metal layers 52c and 54c may be Au films. The first pad layer 52 is connected to the first conductive film 50a by a third solder bump 56a formed therebetween, and the second pad layer 54 is connected to the second conductive film 50b by a fourth solder bump 58a formed therebetween. The third solder bump 56a is made from a metal compound having a melting point of 255° C. or around 317° C., such as SnAgAu. If SnAgAu is used for the third solder bump 56a, the amount of Ag is in a range of 3.3%–8% or 3%–7.32% by weight, and the amount of Au is in a range of 20%–36.63% or 29.32%–48.96% by weight. In addition, Au can be replaced with one of Pd, Ni, Cu, and Na. The percentage by weight of an element replacing Au in the third solder bump 56a may be different with that of Au. The fourth solder bump 58a may be made of the same metal compound as the third solder bump 56a. The third and fourth solder bumps 56a and 58a may include different elements and/or have different stoichiometry.

A method of bonding a light emitting device to a submount will now be described with reference to FIGS. 3 through 5.

Figure 3:
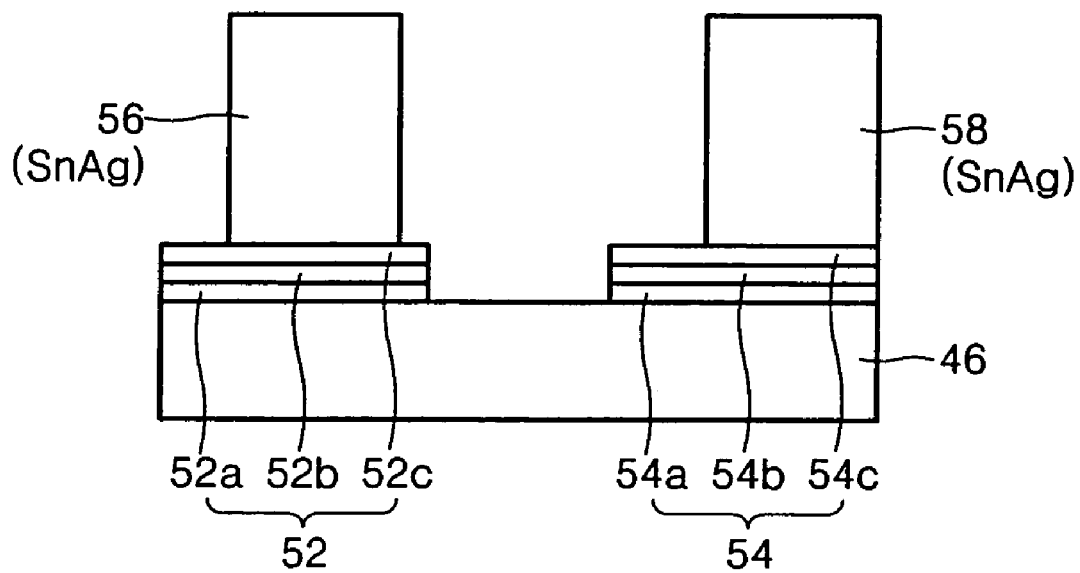
FIGS. 3 through 5 are cross-sectional views illustrating a process of bonding a light emitting device according to an embodiment of the present invention.

First, as illustrated in FIG. 3, the first and second pad layers 52 and 54 are formed on the submount 46 separated by a predetermined interval.

The first and second pad layers 52 and 54 may be formed by sequentially depositing a plurality of material films forming the first and second pad layers 52 and 54 on an entire region of the submount 46, forming a photoresist pattern (not shown) on an upper surface of the material films using a photolithography process in order to limit a region where the first and second pad layers 52 and 54 are to be formed, and inversely etching the sequentially deposited material films an etching process using the photoresist pattern as an etching mask.

The plurality of material films composing the first and second pad layers 52 and 54 are described above. Therefore, the explanation about those is omitted.

However, the third metal layer 52c and the sixth metal layer 54c may be formed of a metal element, which has a plurality of solidus lines due to having two or more intermediate phases in a phase diagram with an element included in the first and second solder bumps 56 and 58 whose description follows. Examples of such a metal element for forming the third metal layer 52c and the sixth metal layer 54c include Au, Pd, Ni, Cu, and Na.

As described above, after the first and second pad layers 52 and 54 are formed, the first solder bump 56 is formed on the first pad layer 52 and the second solder bump 58 is formed on the second pad layer 54. The first and second solder bumps 56 and 58 are formed at the same time. The first and second solder bumps 56 and 58 may be formed of a compound having a low melting point so that the light emitting device is protected from thermal damage during a subsequent bonding process by which the light emitting device 44 is bonded to submount 46.

The present inventor formed the first and second solder bumps 56 and 58 using a metal compound comprising Sn and Ag, for example a SnAg compound. The SnAg compound was made to contain 3.5% by weight Ag in order for it to have a eutectic point where the SnAg compound is promptly transformed from the solid state to the liquid state. However, the final amount of Ag in the solder bump was in the range of 3.3%–8% or 3%–7.32% by weight due to change in volume of the solder bump and melting of Au during bonding.

Figure 6:
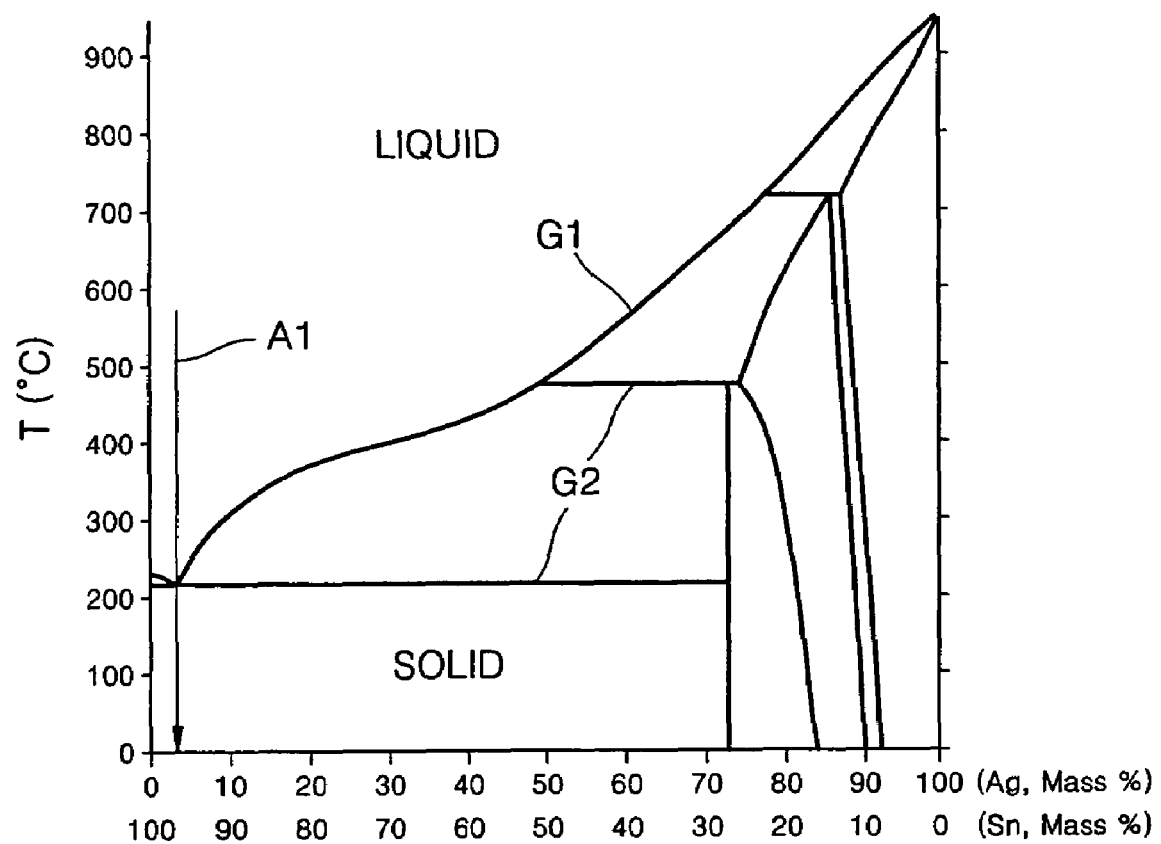
FIG. 6 is a phase diagram of solder used in manufacturing a solder bump according to an embodiment of the present invention.

FIG. 6 is a phase diagram of a metal compound comprising Sn and Ag. In FIG. 6, the percentages of Ag and Sn in the metal compound are plotted on the x-axis and temperature is plotted on the y-axis. Reference numerals G1 and G2 denote a first graph illustrating a liquidus line and a second graph illustrating a solidus line, respectively. Additionally, reference numeral A1 denotes a SnAg compound (3.5% Ag by weight) having the eutectic point.

Referring to FIG. 6, if the first and second solder bumps 56 and 58 are a SnAg compound with 3.5% Ag by weight having the eutectic point, their melting point is 221° C., which is about 60° C. less than the minimum melting point of 280° C. of the conventional AuSn solder bump.

Therefore, if the first and second solder bumps 56 and 58 are formed of SnAg where the amount of Ag is in the range of 3.3%~8% or 3%~7.32% by weight, the process of bonding the light emitting device to the submount can be performed at a much lower temperature than when using conventional AnSn solder bumps. As a result, thermal damage to the light emitting device during the bonding process in which the first and second solder bumps 56 and 58 are used can be prevented.

Figure 4:
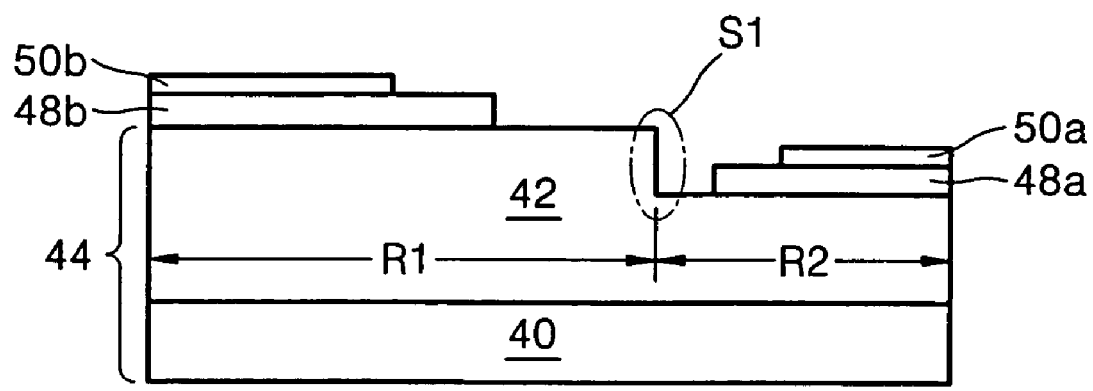

As described above, the first and second solder bumps 56 and 58 are formed on the upper surfaces of the first and second pad layers 52 and 54, respectively, and then the substrate 40 on which the light emitting device is to be formed is prepared as illustrated in FIG. 4. The substrate 40 may be a high-resistance substrate, for example a sapphire substrate. If a light emitting device formed on the substrate 40 emits light through the substrate 40, the substrate 40 can be a transparent substrate such as a silicon substrate. A compound semiconductor layer 42 forming a light emitting device such as an LD or an LED is formed on the substrate 40. The compound semiconductor layer 42 is formed by sequentially depositing the n-type compound semiconductor layer, the active layer, and the p-type compound semiconductor. Then, the result is patterned into a predetermined form. The p-type electrode (not shown) is formed on the p-type compound semiconductor layer and the n-type electrode (not shown) is formed on the n-type compound semiconductor layer. Another material layer may be further formed between the component layers of the compound semiconductor layer 42. For example, an n-type clad layer may be further formed between the n-type compound semiconductor layer and the active layer, and a p-type clad layer may be further formed between the p-type compound semiconductor layer and the active layer. The compound semiconductor layer 42 has the step S1 formed between a portion where the p-type electrode is formed and a portion where the n-type electrode is formed. The p-type electrode is formed in a first region R1 of the compound semiconductor layer 42 protruding to the same height as the step S1, and the n-type electrode is formed in a second region R2 of the compound semiconductor layer 42 not protruding. A p-type electrode pad layer 48b connected to the p-type electrode is formed in the first region R1 of the compound semiconductor layer 42, and a n-type electrode pad layer 48a connected to the n-type electrode is formed in the second region R2 of the compound semiconductor layer 42. The p-type electrode pad layer 48b can be a single layer or can comprise multiple layers. If the p-type electrode pad layer 48b comprises multiple layers, it can be formed using a method including forming a first metal film connected to the p-type electrode, and sequentially depositing second and third metal films on the first metal film. The first metal film may be, for example, an Au film. The second and third metal films may be, for example, a Pt film and a Ti film, respectively. The n-type electrode pad layer 48a may also have the same configuration as the p-type electrode pad layer 48b, but can be formed having a different configuration from the p-type electrode pad layer 48b. First and second conductive films 50a and 50b are formed on the n-type and p-type electrode pad layers 48a and 48b, respectively. The first and second conductive films 50a and 50b may be formed of the same material, for example, Au, or can be formed of different materials.

Figure 5:
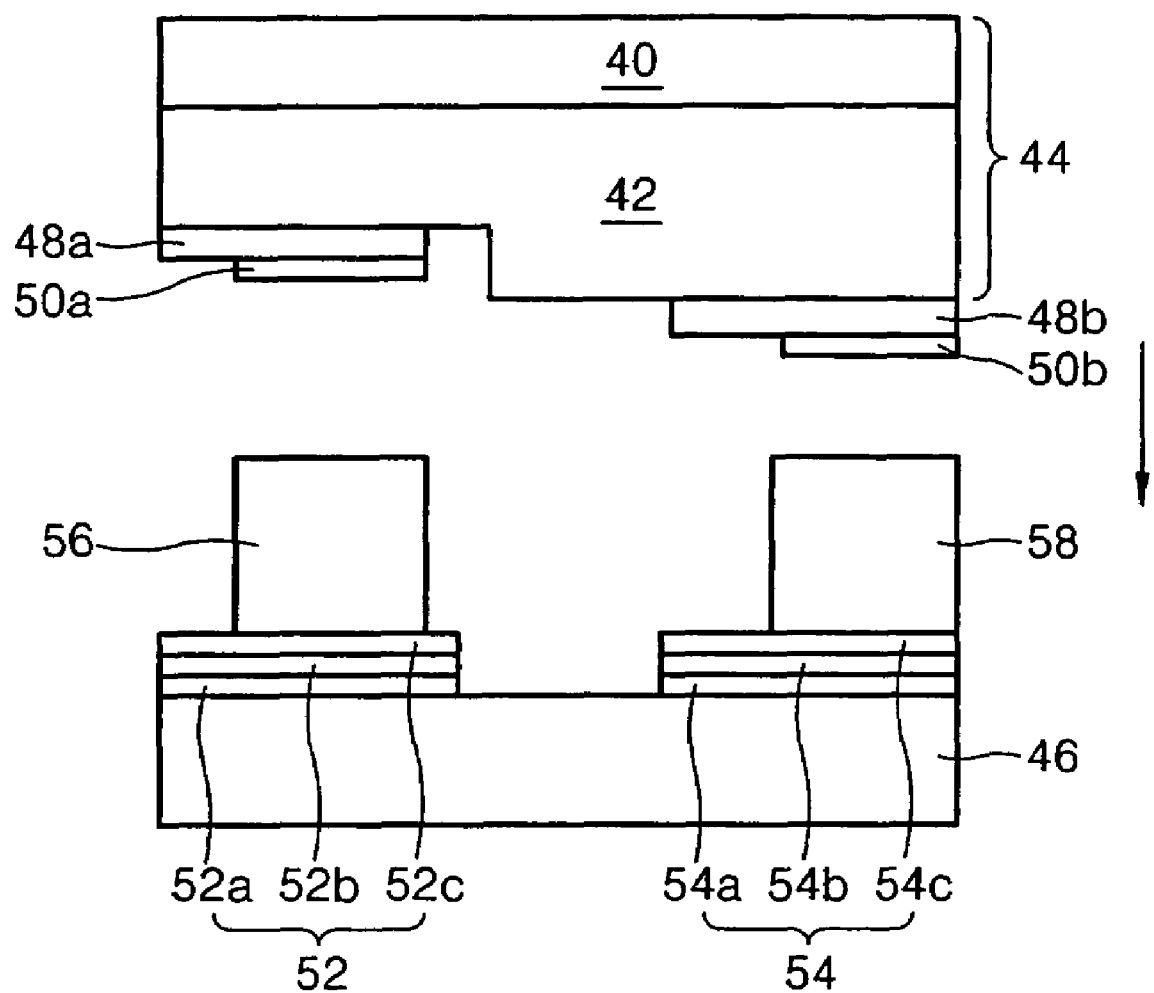

Referring to FIG. 5, the substrate 40 and the submount 46 are arranged so that the first and second conductive films 50a and 50b face the first and second solder bumps 56 and 58. The substrate 40 and the submount 46 are arranged with pinpoint accuracy, and then the first and second conductive films 50a and 50b are brought into contact with the first and second solder bumps 56 and 58, respectively, to flip-chip-bond the light emitting device formed on the substrate 40 to the submount 46. In consideration of the melting points of the first and second solder bumps 56 and 58, the flip-chip bonding is performed at a temperature of 205° C.–235° C. During the flip-chip bonding, an element, such as Au, which is included in the first and second conductive films 50a and 50b, the third metal film 52c of the first pad layer 52, and the sixth metal layer 54c of the second pad layer 54, diffuses into the first and second solder bumps 56 and 58.

During the flip-chip bonding, the third metal film 52c and the sixth metal film 54c act as material supplying films providing the first and second solder bumps 56 and 58 with a predetermined substance by which the melting points of the first and second solder bumps 56 and 58 increase after the flip-chip bonding. The first and second conductive films 50a and 50b play the same role as the third and sixth metal films 52c and 54c. Therefore, if the third and sixth metal films 52c and 54c are referred to as a first material supplying film, the first and second conductive films 50a and 50b can be referred to as a second material supplying film.

The flip-chip bonding may be performed in a period of 5~10 seconds, but the flip-chip bonding time can be regulated if necessary. In addition, a predetermined force, for example, a force in a range of 10 g–100 g, can be applied during the flip-chip bonding process. Thus, the diffusion capability of the Au in the first and second solder bumps 56 and 58 can be increased.

During the flip-chip bonding process, the light emitting device 44 is bonded to the submount 46, and the first and second solder bumps 56 and 58, as illustrated in FIG. 2, become the third and fourth solder bumps 56a and 58a having an amount of Au in the range of 29.32–48.96% by weight.

During the flip-chip bonding process, if the predetermined substance to be melted into the first and second solder bumps 56 and 58 is not Au but another element, for example Pd, Ni, Cu, or Na, the amount of the element included in the third and fourth solder bumps 56a and 58a can be different from the case in which the predetermined substance is Au.

If the first and second solder bumps 56 and 58 are formed of SnAg and Au is melted in the first and second solder bumps 56 and 58 during the flip-chip bonding process, the composition of third and fourth solder bumps 56a and 58a becomes SnAgAu.

Figure 7:
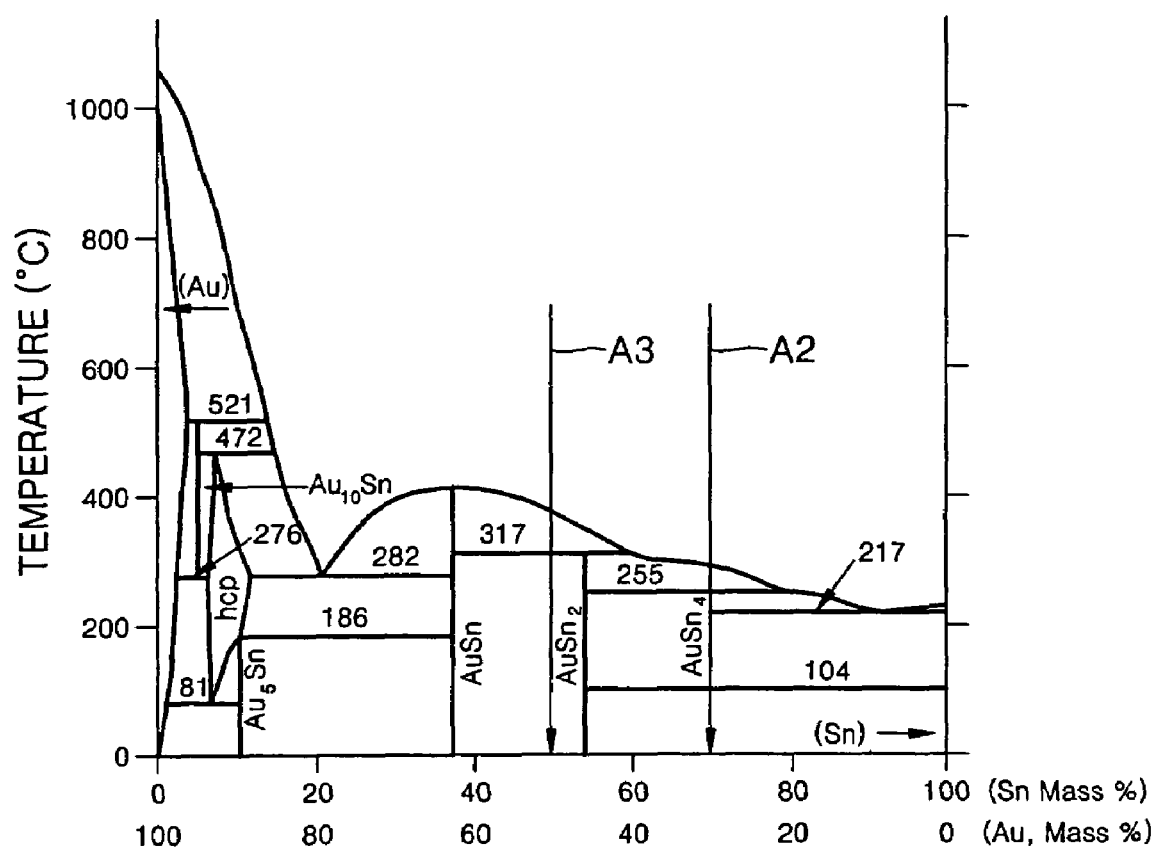
FIG. 7 is a phase diagram of a solder bump formed using a method of manufacturing a solder bump according to an embodiment of the present invention.

FIG. 7 is a phase diagram of AnSn. Referring to FIG. 7, when the amount of Au is 29.32% by weight (A2), the melting point is 255° C. When the amount of Au is 48.96% by weight (A3), the melting point is 317° C. Therefore, It is found that the melting point of the third and fourth solder bumps 56a and 58a is in the range of 255° C.–317° C. when the amount of Au is in the range of 29.32–48.96% by weight.

The numbers in FIG. 7 denote melting points of AuSn compounds having solidus lines corresponding to the numbers.

When the flip-chip bonding is completed, the melting point of the third and fourth solder bumps 56a and 58a is equal to or greater than 255° C. Therefore, in a following process, for example, a packaging process, high temperature characteristics of the third and fourth solder bumps 56a and 58a can be maintained.

In detail, the packaging process is usually performed at a temperature equal to or less than 200° C. The temperature is much lower than the melting point of the third and fourth solder bumps 56a and 58a, and thus the third and fourth solder bumps 56a and 58a have the same phase in the packaging process when they are first formed.

Accordingly, the third and fourth solder bumps 56a and 58a are not affected by the subsequent flip-chip bonding process, which is performed at a low temperature so that the light emitting device 44 does not sustain thermal damage. Therefore, a driving voltage of the light emitting device 44 is not increased.

Considering the above descriptions in viewpoint of forming the third and fourth solder bumps 56a and 58a. The submount 46 may consider as a base substrate on which the first and second solder bumps 56 and 58 are formed. The third and sixth metal films 52c and 54c of the first and second pad layers 52 and 54, and the first and second conductive films 50a and 50b are material supplying films providing the predetermined element. The predetermined element is combined with an element of the first and second solder bumps 56 and 58 to form a compound having a plurality of intermediate phases and solidus lines. In addition, the light emitting device 44 and the n-type and p-type electrode pad layers 48a and 48b may act as an upper layer which contacts the first and second solder bumps 56 and 58 formed on the first and second pad layers 52 and 54 and allows the predetermined element provided from the material supplying films to much more diffuse into the first and second solder bumps 56 and 58.

As described the above according to the present invention, a flip-chip bonding of a light emitting device with a submount is performed at a much lower than conventional temperature. As a result, the present invention solves the problem of increased electrode resistance in a light emitting device, which results in an increased driving voltage, arising during the conventional flip-chip bonding process. In addition, according to the present invention, the melting point of a solder bump formed during the flip-chip bonding process is 255° C. or more. Thus, in a subsequent process that is performed at a temperature of less than 200° C., the solder bump maintains its first state. In other words, the solder bump can be maintained in a thermally stable condition. Therefore, according to the present invention, uniform laser beams can be emitted from a light emitting device, in particular, from an LD, and emission characteristics and reliability of the LD can be improved.

It should be understood that the above description of exemplary embodiments of the present invention is provided in order that this disclosure be thorough and completely convey the concept of the present invention to those of skill in the art. The above description should not be construed as limiting the scope of the present invention. For example, by referring to the phase diagram of FIG. 7, the amount of Au contained in the third and fourth solder bumps 56a and 58a during the flip-chip bonding can be varied outside of the described ranges, i.e., to be greater than the 48.96% by weight or smaller than 39.32% by weight, without departing from the scope of the present invention. Also, a solder bump may be formed only between the second pad layer 54 and the second conductive film 50b within the scope of the present invention.

What is claimed is:

1. A solder bump formed of a compound comprising a first element through a third element,
   wherein the first element and the third element form a compound having a plurality of intermediate phases and solidus lines, the third element being Au having 29.32 to 48.96 wt. %.

2. The solder bump of claim 1, wherein the first element is Sn.

3. The solder bump of claim 1, wherein the second element is Ag.

4. The solder bump of claim 2, wherein the second element is Ag.

5. The solder bump of claim 3, wherein the amount of Ag is in the range of 3.3%–8% by weight.

6. A method of bonding a light emitting device, comprising:
   (a) forming a light emitting device comprising a p-type electrode, an n-type electrode, and a compound semiconductor layer formed between the p-type electrode and the n-type electrode;
   (b) forming a first pad layer and a second pad layer on a submount such that the first and second pad layers are separated from one another;
   (c) forming, on the light emitting device, a pad layer contacting the p-type electrode and another pad layer contacting the n-type electrode;
   (d) forming a first solder bump on the first pad layer and a second solder bump on the second pad layer;
   (e) bonding the light emitting device to the submount by bonding the pad layer contacting the n-type electrode and the pad layer contacting the p-type electrode with the first and second solder bumps, respectively,
   wherein, the first and second pad layers include a first predetermined material film that supplies the first and second solder bumps with a predetermined substance during the bonding, to increase the melting point of the first and second solder bumps.

7. The method of claim 6, wherein a Ti film, a Pt film, and the first predetermined material film are sequentially deposited to form the first and second pad layers.

8. The method of claim 6, wherein an Au film, a Pt film, and a Ti film are sequentially deposited to form the pad layer contacting the n-type electrode and the pad layer contacting the p-type electrode.

9. The method of claim 6, wherein the first and second solder bumps are formed of SnAg and the amount of Ag is in the range of 3.3%–8%.

10. The method of claim 6, wherein the first predetermined material film comprises a first element which forms a compound having a plurality of intermediate phases and solidus lines together with an element included in the first and second solder bumps.

11. The method of claim 7, wherein the first predetermined material film comprises a first element which forms a compound having a plurality of intermediate phases and solidus lines together with an element included in the first and second solder bumps.

12. The method of claim 10, wherein the first element is one selected from the group consisting of Au, Pd, Ni, Cu, and Na.

13. The method of claim 6, wherein step (e) comprises:
arranging the light emitting device and the submount so that the pad layer contacting the n-type electrode and the pad layer contacting the p-type electrode face the first and second solder bumps, respectively;
bringing the pad layer contacting the n-type electrode and the pad layer contacting the p-type electrode into contact with the first and second solder bumps, respectively; and
heating the resultant structure at a temperature of 205–235° C.

14. The method of claim 6, wherein the solder bump whose the melting point is increased is formed of SnAgAu in which the amount of Ag is in the range of 3.3%–8% and the amount of Au is in the range of 20%–36.63%.

15. The method of claim 13, wherein during the heating process, a force applied to the resultant structure is in the range of 10 g–100 g.

16. The method of claim 6, wherein a second predetermined material film is further formed on the pad layer contacting the n-type electrode and the pad layer contacting the p-type electrode, and the second predetermined material film has the same function as the first predetermined material film.

17. The method of claim 16, wherein the second predetermined material film comprises a second element which forms a compound having a plurality of intermediate phases and solidus lines together with an element included in the first and second solder bumps.

18. The method of claim 17, wherein the second element is one selected from the group consisting of Au, Pd, Ni, Cu, and Na.

19. The solder bump of claim 3, wherein the amount of Ag is in the range of 3% to 7.32% by weight.

\* \* \* \* \*